United States Patent
Guha

Patent Number: 5,476,798
Date of Patent: Dec. 19, 1995

[54] PLASMA DEPOSITION PROCESS WITH SUBSTRATE TEMPERATURE CONTROL

[75] Inventor: Subhendu Guha, Troy, Mich.

[73] Assignee: United Solar Systems Corporation, Troy, Mich.

[21] Appl. No.: 157,322

[22] Filed: Nov. 26, 1993

Related U.S. Application Data

[63] Continuation-in-part of Ser. No. 907,750, Jun. 29, 1992, abandoned.

[51] Int. Cl.⁶ .................................................. H01L 31/20
[52] U.S. Cl. .................... 437/4; 437/101; 437/113; 427/574; 427/575; 427/578; 136/258; 430/65
[58] Field of Search ................... 437/4, 100–101, 437/113; 427/574–575, 578; 136/258 AM; 430/65

[56] References Cited

U.S. PATENT DOCUMENTS

| | | | |
|---|---|---|---|
| 4,492,810 | 1/1985 | Ovshinsky et al. | 136/255 |
| 4,504,518 | 3/1985 | Ovshinsky et al. | 427/575 |
| 4,515,107 | 5/1985 | Fournier et al. | 118/718 |
| 4,517,223 | 5/1985 | Ovshinsky et al. | 427/575 |
| 4,701,343 | 10/1987 | Ovshinsky et al. | 427/575 |
| 4,713,309 | 12/1987 | Johncock et al. | 430/65 |
| 4,721,663 | 1/1988 | Johncock et al. | 430/65 |
| 4,729,341 | 3/1988 | Fournier et al. | 118/723 |
| 4,800,174 | 1/1989 | Ishihara et al. | 437/101 |
| 5,030,476 | 7/1991 | Okamura et al. | 427/575 |
| 5,034,333 | 7/1991 | Kim | 437/4 |
| 5,061,511 | 10/1991 | Saitoh et al. | 427/575 |
| 5,114,498 | 5/1992 | Okamoto et al. | 136/258 |
| 5,114,770 | 5/1992 | Echizen et al. | 427/575 |
| 5,194,398 | 3/1993 | Miyachi et al. | 437/108 |
| 5,204,272 | 4/1993 | Guha et al. | 437/4 |
| 5,232,507 | 8/1993 | Ohtoshi et al. | 118/719 |
| 5,248,348 | 9/1993 | Miyachi et al. | 136/258 |
| 5,256,576 | 10/1993 | Guha et al. | 437/4 |

FOREIGN PATENT DOCUMENTS

| | | | |
|---|---|---|---|
| 58-57757 | 4/1983 | Japan | 136/258 AM |
| 62-279304 | 12/1987 | Japan | |
| 1-152765 | 6/1989 | Japan | 136/258 AM |

*Primary Examiner*—Aaron Weisstuch
*Attorney, Agent, or Firm*—Gifford, Krass, Groh, Sprinkle, Patmore, Anderson & Citkowski

[57] ABSTRACT

In a glow discharge deposition process for the preparation of hydrogenated, Group IV semiconductor alloys, the substrate is maintained at a temperature which is positively correlated with the deposition rate and which is high enough to impart sufficient kinetic energy to the layer to activate the removal of undesirable morphologies, but low enough to prevent degradation of the layer caused by the excessive loss of hydrogen.

9 Claims, 3 Drawing Sheets

PLASMA DEPOSITION PROCESS WITH SUBSTRATE TEMPERATURE CONTROL

RELATED APPLICATION

This is a continuation-in-part of U.S. patent application Ser. No. 907,750 filed Jun. 29, 1992, abandoned in favor of continuation application Ser. No. 185,309, filed Jan. 21, 1994, now U.S. Pat. No. 5,346,853.

FIELD OF THE INVENTION

This invention relates generally to the preparation of thin film semiconductor materials. Specifically, the invention relates to the glow discharge deposition of hydrogenated, Group IV semiconductor alloy materials. Most specifically, the invention relates to a glow discharge deposition process in which substrate temperature is controlled as a function of the deposition rate.

BACKGROUND OF THE INVENTION

Glow discharge deposition is employed for the preparation of thin films of a variety of materials such as semiconductor materials, electrical insulators, optical coatings, polymers and the like. In a typical glow discharge deposition, a process gas, which includes a precursor of the material being deposited, is introduced into a deposition chamber, usually at subatmospheric pressure. Electromagnetic energy, either AC or DC, is introduced into the chamber and energizes the process gas so as to create an excited plasma therefrom. The plasma decomposes the precursor material and deposits a coating on a substrate maintained near or in the plasma region. Frequently, the substrate is heated to facilitate growth of the deposit thereupon. This technology is well known in the art.

In many glow discharge deposition processes, the rate of deposition is fairly slow, typically on the order of 2–10 angstroms per second. This low deposition rate can be a drawback in commercial applications, particularly where relatively thick layers of material are being prepared. Thin film photovoltaic devices generally include a relatively thick layer of intrinsic semiconductor material disposed between oppositely doped semiconductor layers. This intrinsic layer may be on the order of many thousands of angstroms thick. Similarly, electrophotographic photoreceptors are often manufactured from amorphous silicon alloys, and typically include layers which may be several microns thick. Low deposition rate processes are clearly unattractive for applications such as these, and a number of higher speed processes have been developed which can deposit layers at rates of 10–200 angstroms per second. In some instances, these high deposition rate processes employ microwave energy to create the plasma, whereas in other instances other frequencies of electromagnetic energy are employed.

One very important class of semiconductor materials which are manufactured by plasma deposition processes are the Group IV semiconductor alloys. Most typically, these materials comprise alloys of silicon and/or germanium together with alloying, modifying and dopant elements, the most typical of which are hydrogen, halogens, and the Group III and Group V elements. Within the context of this application, these materials will be generally described as hydrogenated, Group IV semiconductor alloys and will include amorphous, microcrystalline, crystalline and polycrystalline materials. It has generally been found that for particular electronic applications, hydrogenated Group IV alloys which have been deposited at relatively high rates have electronic properties which are somewhat inferior to those of materials deposited at lower rates. It is speculated that this is the result of several factors. It is believed that materials deposited at higher rates frequently include undesirable morphologies, such as deviant bonds, broken bonds, strained bonds, vacancies and the like, and these defects can affect the transport properties of the materials. Additionally, it has been found that Group IV semiconductor alloys deposited at high rates tend to incorporate more hydrogen than do comparable materials prepared under lower deposition rate conditions. Hydrogen content is a particularly important parameter for the semiconductor alloys, since hydrogen tends to increase the band gap of the materials thereby changing their optical and electronic properties. If these high-gap materials are incorporated into photovoltaic devices, it has been found that the increased hydrogen content will decrease the short-circuit current of the cell (Jsc) and increase the open-circuit voltage (Voc) of the device. Generally, it has been found that photovoltaic devices which include Group IV semiconductor layers prepared in accord with prior art high-deposition rate processes have efficiencies which are lower than the efficiencies of similar devices prepared by low deposition rate processes. It is speculated that this is due both to the effect of hydrogen on the band gap and the effect of undesirable morphologies.

As noted above, the substrate in a glow discharge deposition process is typically heated to facilitate growth of the deposit; and in accord with the present invention, it has been found that substrate temperature is a parameter which has a direct influence upon the quality of the deposited semiconductor material and hence the efficiency of photovoltaic devices manufactured therefrom. Heretofore, the art has paid little attention to the parameter of substrate temperature. In low deposition rate processes of the prior art, substrate temperatures in the range of 500°–600° K. (227°–327° C.) have been found to provide quality deposits of hydrogenated Group IV semiconductor alloys. When the art turned to the use of high-deposition rate processes many parameters, including substrate temperature, were maintained constant. For example, U.S. Pat. Nos. 4,504,518; 4,517,223 and 4,701,343 all describe high-deposition rate, microwave energized, glow discharge deposition processes. These patents broadly recite that the depositions may be carried out at a substrate temperature in the range of 20° C. to 400° C. and that a preferred substrate temperature range is 250°–325° C. U.S. Pat. No. 4,515,107 shows the preparation of silicon alloy materials by a microwave process employing substrate temperatures of 350° C.; U.S. Pat. No. 4,713,309 describes the manufacture of silicon photoreceptors in a microwave energized process carried out at substrate temperatures of approximately 225° C.

While the prior art describes a number of high deposition rate processes carried out at several different substrate temperatures, the prior art has not recognized that substrate temperature is a parameter which must be controlled with specific regard to deposition rate, in order to provide high quality semiconductor materials. The prior art, in fact, teaches away from this important principle of the present invention. U.S. Pat. No. 4,713,309 discloses the deposition of hydrogenated Group IV semiconductor alloys at rates of 20, 40, and 100 angstroms per second, and throughout the experimental series, the substrate temperature was maintained at a constant 300° C. A similar teaching is found in U.S. Pat. No. 4,721,663 wherein a series of depositions were carried out at various rates ranging from 20–200 angstroms per second, all with a constant substrate temperature of 300° C. U.S. Pat. No. 5,114,770 discloses a series of high rate depositions of hydrogenated silicon alloys, typically in the range of 100 angstroms per second, utilizing substrate temperatures of 180°–280° C. In this series of depositions, there is no correlation made between substrate temperature and deposition rate. Furthermore, in one of the experiments, the substrate temperature inadvertently exceeded 350° C., and it was reported that the semiconductor layer delaminated from the substrate under these conditions.

Thus, it will be appreciated that there is a need for a method wherein high quality layers of hydrogenated, Group IV semiconductor alloys may be prepared at high rates. It will also be appreciated that the prior art has not been able to provide such a process, and that the prior art has not recognized that substrate temperature, in a glow discharge deposition process, is a parameter which must be controlled as a function of deposition rate. The present invention provides an improved process for the deposition of hydrogenated Group IV semiconductor alloys by maintaining the substrate at a preselected temperature which is positively correlated with the deposition rate. These and other advantages of the present invention will be readily apparent from the drawings, discussion and description which follow.

BRIEF DESCRIPTION OF THE INVENTION

There is disclosed herein a method for the glow discharge deposition of a high quality layer of a hydrogenated, Group IV semiconductor alloy material. According to the method, there is provided a deposition system having a plasma region defined therein. The system includes a conduit for introducing a preselected process gas into the plasma region and a source of electromagnetic energy for activating the process gas so as to form a plasma therefrom. The method includes the further steps of supporting a substrate in the plasma region; introducing a process gas having hydrogen and a Group IV semiconductor element therein into the system; maintaining the process gas at a process pressure which is less than atmospheric; inputting a preselected power level of electromagnetic energy into the process gas so as to create a plasma from, and decompose, the process gas into deposition species which deposit a layer of a hydrogenated, Group IV semiconductor alloy material on the substrate at a deposition rate which corresponds to the power level; and maintaining the substrate at a preselected temperature which is positively correlated with the deposition rate and which is high enough to impart sufficient kinetic energy to the layer to activate the removal of undesirable morphologies therefrom, but low enough to prevent degradation of the layer caused by loss of hydrogen.

In accord with one embodiment of the invention, the step of maintaining the substrate at the preselected temperature comprises maintaining the substrate at a temperature in the range of 300° C.–350° C. when the deposition rate is in the range of 10–20 angstroms per second; in the range of 325° C. to 400° C. when the deposition rate is above 20, but below 50 angstroms per second; and in the range of 350° C.–500° C. when the deposition rate is 50 angstroms per second or more.

In another embodiment of the invention, the step of maintaining the substrate at a preselected temperature comprises maintaining the substrate at a temperature in the range of 300° C.–350° C. when the deposition rate is 10 angstroms per second; 300° C.–400° C. when the deposition rate is 20 angstroms per second; 300°–440° C. when the deposition rate is 30 angstroms per second; 315°–475° C. when the deposition rate is 40 angstroms per second; 325°–500° C. when the deposition rate is 50 angstroms per second; 350°–515° C. when the deposition rate is 60 angstroms per second. In particular embodiments, the method is adapted for the manufacture of photovoltaic devices.

DETAILED DESCRIPTION OF THE INVENTION

Figure 1:
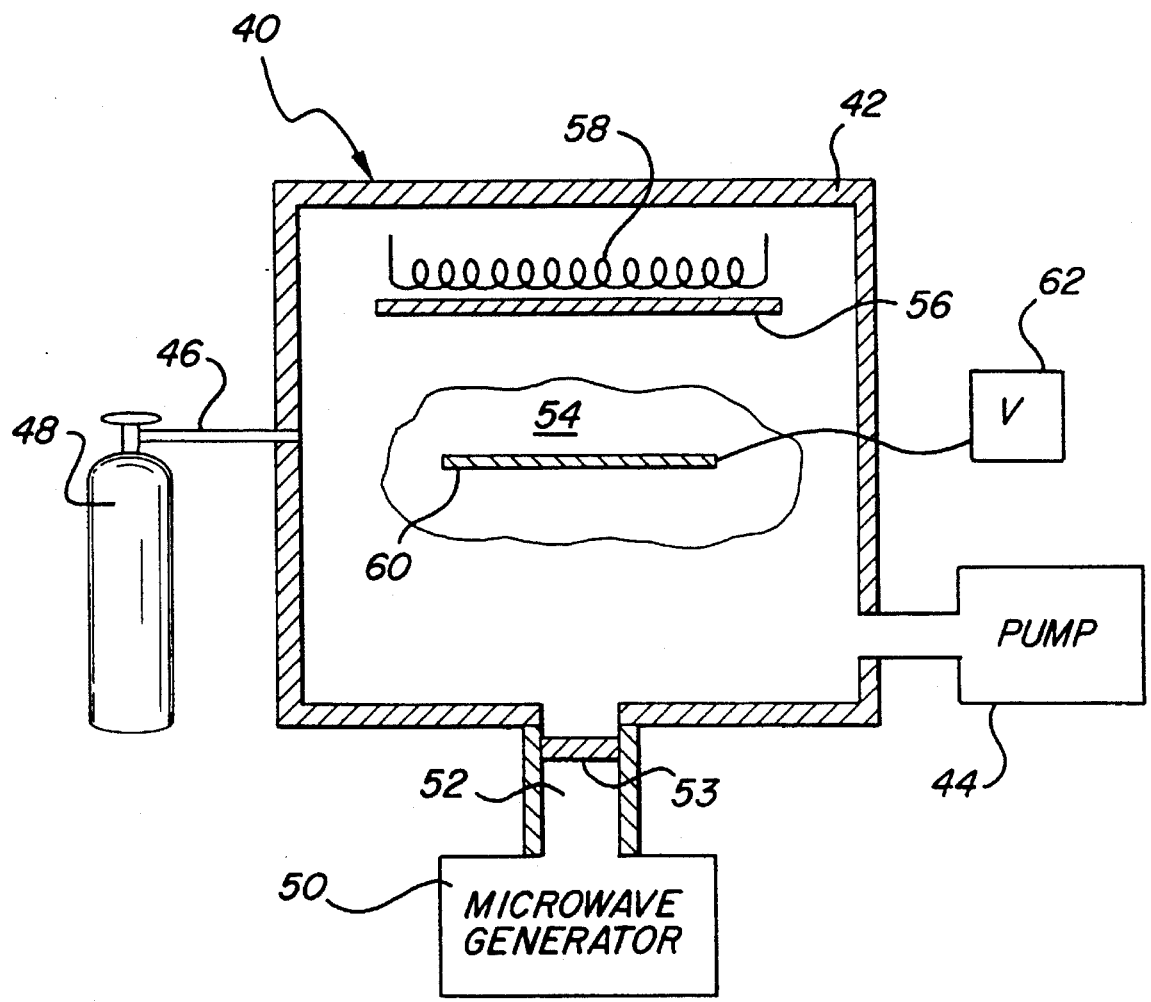
FIG. 1 is a schematic depiction of one type of deposition system which may be employed in the practice of the present invention.

The present invention recognizes the fact that substrate temperatures for the deposition of hydrogenated Group IV semiconductor materials should be correlated with the deposition rate if optimum materials are to be deposited, and higher speed depositions require higher substrate temperatures. The present invention may be practiced with a variety of glow discharge deposition techniques, including microwave energized techniques as well as other AC techniques such as radio frequency energized processes, as well as with DC energized techniques. Referring now to FIG. 1, there is shown a schematic depiction of a generalized microwave energized deposition system which may be used in the practice of the present invention. The system 40 includes a chamber 42 which is sealable and capable of sustaining a subatmospheric pressure. In communication with the chamber 42 is a vacuum pump 44 and a conduit 46 for supplying a preselected gas mixture therein from the gas supply cylinder 48, it being understood that in most instances a mixture of gasses from a manifolded supply system will generally be employed. By control of the pump 44 and the process gas conduit 46 an appropriate deposition atmosphere and pressure may be maintained within the chamber 42. The apparatus 40 also includes a microwave generator 50 operably connected to the chamber 42 by a wave guide 52 having a microwave transmissive window 53 at one end thereof. The microwave generator 50 energizes the process gas in the chamber 42 so as to create a plasma therefrom in a plasma region 54. The apparatus of FIG. 1 also includes a deposition substrate 56 maintained in the deposition system, proximate the plasma region 54, it being understood that the substrate 56 may be directly in the plasma region 54 also. As depicted in this drawing, the system includes a heater 58 which in this instance is a resistance heater, although it is to be understood that radiant heaters and the like may be similarly employed, and in some instances, self-heating of the substrate by the energetic plasma may occur; in which case, substrate temperature control may need to be accomplished by selective cooling. It should also be noted that in this embodiment, the system includes a bias wire 60 disposed in the plasma region 54. The bias wire 60 is in electrical communication with a power supply 62, and it has been found that by imposition of an appropriate potential upon the bias wire 60, the bombardment of the substrate 56 by activated species in the plasma region 64 may be selectively controlled.

In a typical deposition process, an appropriate substrate is placed in the chamber 42 which is sealed and then pumped down by the vacuum pump 44 to a pressure substantially below atmospheric. In some instances, the chamber is purged with nitrogen, argon or other such inert gas during the pumpdown to facilitate the removal of oxygen, water vapor or other potentially interfering species. The process gas is introduced into the chamber 42 from the conduit 46. The substrate heater 58 is energized so as to maintain the substrate 56 at a preferred deposition temperature, as will be described herein below. As will be appreciated by those of skill in the art, the substrate heater 58 may include a temperature sensor and associated control circuitry for purposes of maintaining a set temperature at the substrate 56. In the next stage of the process, the microwave generator 50 is energized and a plasma is generated from the process gas in the plasma region 54. The bias wire 60 is energized, typically with a positive voltage, and a film of semiconductor alloy material deposits onto the substrate 56. By control of the composition of the process gas, the composition of the resultant alloy layer may be controlled.

Figure 2:
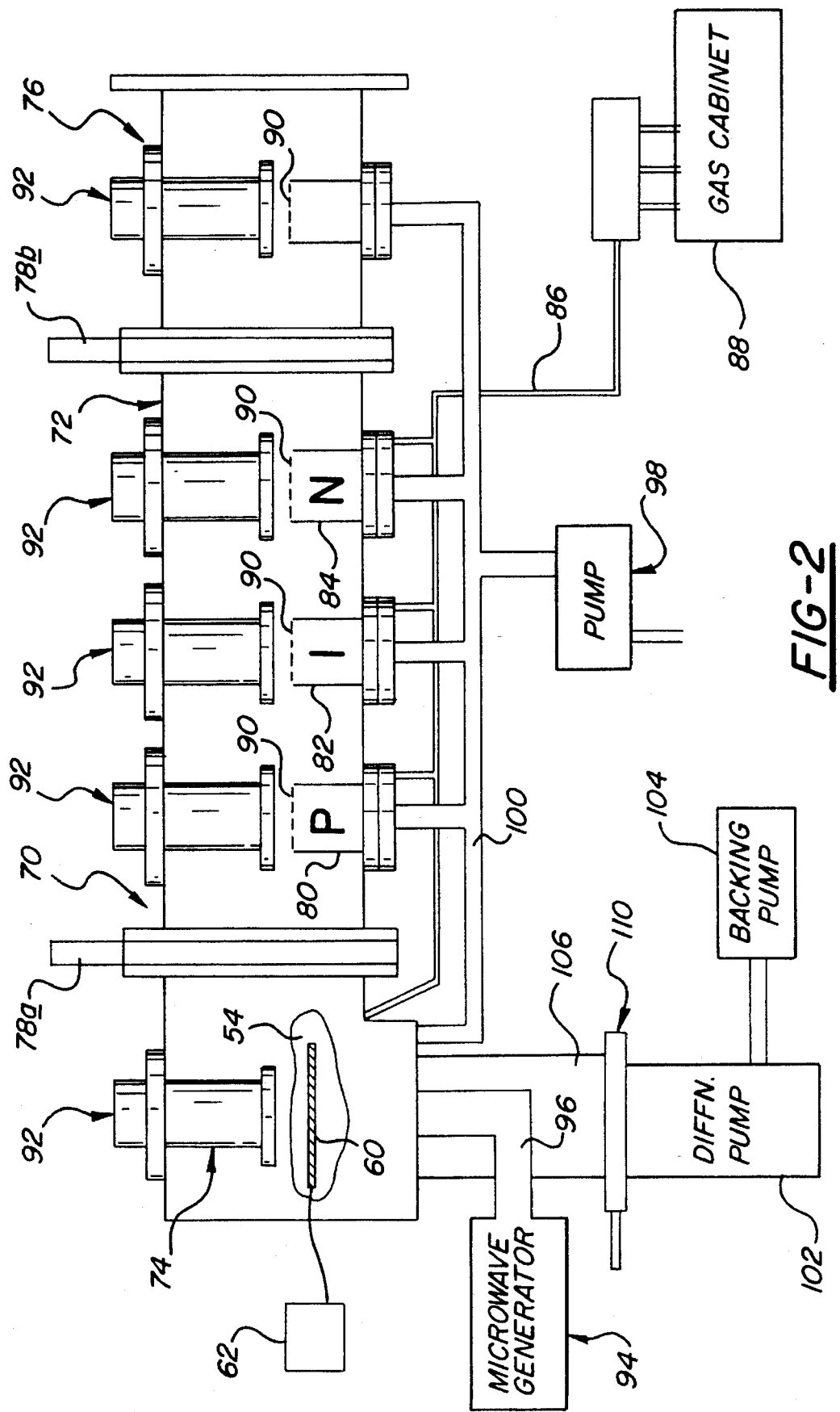
FIG. 2 is a schematic depiction of a multiple-chamber microwave/radio frequency energized deposition apparatus which may be employed in the practice of the present invention.

The present invention may also be utilized in other types of plasma deposition processes. For example, microwave energy may be introduced into the chamber by an antenna. In other variations, the microwave generator 50, wave guide 52 and window 53 of FIG. 1 may be replaced by an electrode, disposed in the chamber and operably connected to a power supply such as a DC power supply or a radio frequency power supply. The electrode is typically made the cathode of the power supply and the substrate 56 is grounded, or made the anode of the supply. FIG. 2 depicts another plasma deposition apparatus 70 operative to deposit a plurality of semiconductor layers upon a substrate. The apparatus 70 is notable insofar as it includes a radio frequency energized deposition chamber 72 as well as a microwave energized deposition chamber 74. In this manner, the apparatus may be used for preparation of semiconductor devices under a variety of conditions. The apparatus 70 further includes a loading chamber 76 for removal and replacement of substrates. Separating the RF chamber 72, microwave chamber 74 and loading chamber 76 are gate valves 78a, 78b; and as is well known to those of skill in the art, such valves may be readily opened and closed to allow passage of a fairly large substrate between adjoining chambers.

The RF chamber 72 includes three separate deposition regions 80, 82, and 84 adapted to deposit p-type intrinsic and n-type semiconductor layers, respectively. Toward that end, each deposition region is provided with a gas supply via a manifolded conduit 86 communicating with a gas supply cabinet 88. Each RF deposition region 80, 82, 84 includes a cathode 90 which is energized by radio frequency energy via a power supply (not shown). Each RF deposition region 80, 82, 84 further includes a substrate holder and heater assembly 92 which retains and heats a deposition substrate. It will also be noted that the loading chamber 76 includes a substrate heater assembly 92 and further includes a cathode 90. The heater 92 and cathode 90 may be employed to pre-treat the substrate, as for example by plasma cleaning, deposition of particular layers and the like, as is well known in the art.

The microwave chamber 74 also includes a substrate heater assembly 92, but it will be noted that this chamber 74 includes no cathode assembly. Instead, the microwave chamber is supplied with microwave energy via a microwave generator 94 operatively communicating therewith by a wave guide 96 through a microwave transmissive window. It will also be noted that the microwave chamber 74 includes a bias wire 60, in communication with a power supply 62 as described hereinabove.

The apparatus 70 further includes a process pump 98 operatively communicating with the various chambers via a vacuum conduit 100. It will also be noted that the microwave chamber 74 includes a separate pumping system comprised of a diffusion pump 102 having a backing pump 104 associated therewith and operatively connected to the microwave chamber 74 by a conduit 106 and a gate valve 110. The microwave deposition process typically employs a very high flow of process gas and operates in a pressure regime different from the RF energized deposition and hence the separate pumping system is typically employed to maintain the proper pressure under these dynamic conditions.

The apparatus 70 may be employed to manufacture a variety of configurations of semiconductor devices. In a typical process, a substrate is placed into the loading chamber 76; the pressure therein is lowered and any pretreatment such as plasma cleaning is carried out. The gate valve 78b is then opened and the substrate transferred by a conveyor system (not shown) to either the RF or microwave deposition chambers. By employing the appropriate deposition stations in the RF chamber 72 various doped or intrinsic base layers may be placed on the substrate. By opening the gate valve 78a and conveying the substrate into the microwave deposition chamber 74, the deposition of semiconductor layers by microwave energy may be carried out. The principles of the present invention may be advantageously employed in connection with both the RF and microwave portions of the apparatus.

It has been found, in accord with the present invention, that, in the glow discharge deposition of hydrogenated Group IV semiconductor alloys, the temperature of the substrate must be positively correlated with the deposition rate. Within the context of the present disclosure, positive correlation means that the temperature of the substrate must increase as the deposition rate increases. As noted above, higher deposition rates have heretofore been correlated with semiconductor materials of lower quality. By raising the substrate temperature, the kinetic energy of the material deposited thereupon is increased. An increase in kinetic energy activates the removal of undesirable morphologies from the semiconductor film. These undesirable morphologies may comprise deviant bonding states such as bent, strained or otherwise distorted chemical bonds, vacancies where a bonding site is not satisfied, dangling bonds and the like. Undesirable morphologies may also comprise polymeric inclusions, impurities, voids, and the like. Removal may be accomplished by actual physical departure of the undesirable morphology from the substrate as a result of thermal activation, as well as by a chemical reaction of the undesirable morphology with a reactive material such as hydrogen or a halogen. In some instances the undesirable morphology is removed through a process of reformation; whereby as a result of chemical reaction and/or physical rearrangement, it is converted into a desirable morphology. Therefore, within the context of this disclosure, removal shall refer to any process which decreases the presence of undesirable morphologies.

It is to be understood that in a plasma deposition process, a large number of different chemical species are generated. A dynamic equilibrium situation exists in which certain of the species deposit onto the substrate while other species, both desirable and undesirable, are removed from the substrate. This process is somewhat analogous to the growth of a crystal. When deposition occurs at a very high rate, it is often not possible to establish an equilibrium condition favoring growth of the desired species; and as a consequence, larger numbers of undesirable morphologies tend to be incorporated into films deposited at high rates. By increasing the substrate temperature, the kinetic energy of the deposited film and of species impinging upon the substrate is increased. This increase in kinetic energy activates the removal of the undesirable morphologies.

As the deposition rate increases, the amount of hydrogen retained in the semiconductor film also increases. As noted above, the increased amount of hydrogen increases the band gap of the semiconductor material thereby changing its electrical properties. It has been found, in accord with the present invention that increasing the substrate temperature tends to decrease the amount of hydrogen in the film, possibly by imparting extra kinetic energy thereto, which activates its removal. Therefore, the band gap of the semiconductor layer may be maintained constant as the deposition rate increases, if substrate temperature is increased. Therefore, in accord with the present invention, it is required that the substrate temperature be maintained at a level low enough to prevent degradation of the semiconductor layer caused by loss of hydrogen therefrom. Furthermore, it has been found that, in some instances, excessive temperature can damage the semiconductor layer and/or the substrate, as for example by causing crystallization, melting or decomposition.

Figure 3:
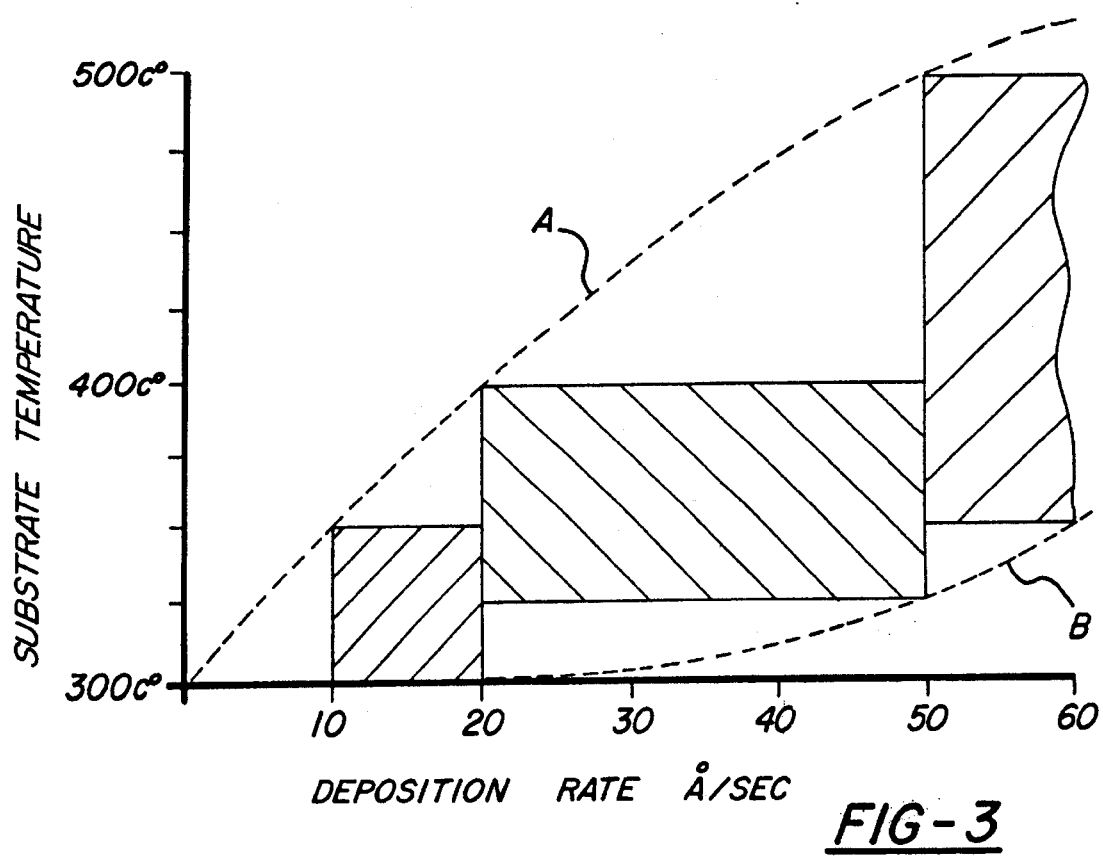
FIG. 3 is a graph of deposition rate, in angstroms per second vs. substrate temperature in degrees Centigrade illustrating one preferred embodiment of the present invention.

Referring now to FIG. 3, there is shown a graph which displays one preferred range of temperatures for the glow discharge deposition of hydrogenated, silicon based alloys prepared for use in photovoltaic devices, in accord with the present invention. It is to be understood that this graph is representative of one particular set of conditions over a general range of deposition rates of 10–60 angstroms per second; and, in accord with the general principles disclosed herein, other operational ranges may be established depending upon the particular semiconductor alloy material being prepared, and the application for which it is prepared.

The graph of FIG. 3 depicts a first curve A delineating an upper temperature range and a second curve B delineating a lower temperature range. In general, if the upper range is exceeded, semiconductor quality declines as a result of loss of hydrogen and/or harm to the semiconductor layer. If the temperature is below the lower limit, activation of the removal of undesirable morphologies does not occur and/or excessive hydrogen is retained. Within the area bounded by the curves A and B, are a series of blocks which correspond to generally preferred, empirically determined, temperature ranges for depositions at various rates. As will be noted, for deposition rates of 10–20 angstroms per second, a temperature range of approximately 300°–350° C. is typically preferred. At a deposition rate of 20–50 angstroms per second the temperature range expands to approximately 325°–400° C. At rates of 50 angstroms per second and above the range is 350°–500° C. The optimum maximum temperature will increase somewhat as deposition rates rise above 60 angstroms per second; but, crystallization, thermal degradation and other problems start to dominate as temperatures get too high. For silicon based alloys, the maximum substrate temperature will be generally below 535 ° C. These ranges are fairly broad and the particular preferred temperature will depend upon both the material itself and the device for which it is prepared. However, in general, temperature ranges within those bounded by the curves A and B will secure the advantages of the present invention for most depositions of hydrogenated, Group IV semiconductor materials. As will be noted, the preferred substrate temperature rises as deposition rate increases. Nowhere has the prior art noted the necessity of adjusting substrate temperature to correlate with deposition rate in this manner.

Figure 4:
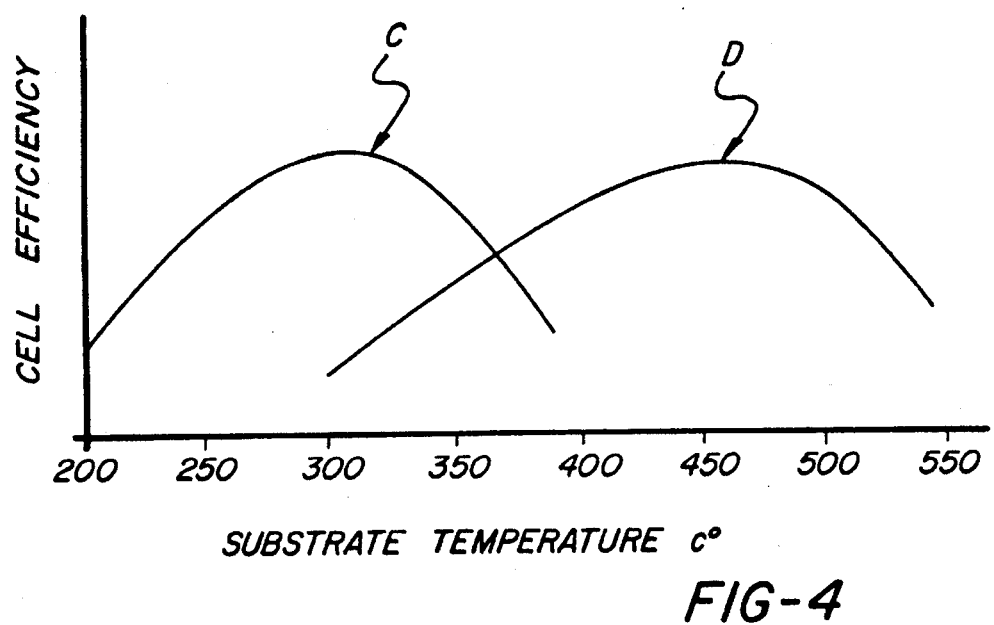
FIG. 4 is a graphic representation of the photoconversion efficiency versus substrate temperature for two groups of photovoltaic devices which were prepared at different deposition rates.

FIG. 4 is further illustrative of the principles of the present invention. Shown therein is a generalized graphic representation of the photoconversion efficiency of two sets of photovoltaic devices of the p-i-n-type plotted vs. the substrate temperature at which the intrinsic layer of each was deposited. Curve C represents deposition conditions for cells in which the intrinsic layer was deposited at a rate of approximately 10 angstroms per second, and it will be noted that cell efficiency peaks when the substrate temperature is in the approximate range of 275°–325° C. As substrate temperatures rise to 400° C., or fall below 275° C., cell efficiency drops dramatically. Curve D is representative of data for similar p-i-n-type cells in which the intrinsic layer was deposited at approximately 55 angstroms per second. It will be noted that for this series of cells, maximum efficiency is obtained with substrate temperatures in the approximate range of 450°–500° C. Substrate temperatures of 300° C., which were appropriate for the low deposition rate material of Curve C are clearly inappropriate for the high deposition rate cells of Curve D as is evidenced by the drop in efficiency.

The foregoing discussion and examples have primarily been concerned with photovoltaic devices. It is to be understood that the principles of the present invention may be applied to any glow deposition process wherein hydrogenated Group IV semiconductor alloys are being prepared, and as such, also have significant utility in connection with the manufacture of electrophotographic drums, image sensors, electronic devices and the like as well as photovoltaic devices. It will be understood that numerous modifications and variations of the inventions may be practiced. The foregoing drawings, discussion and description are merely meant to be illustrative of particular embodiments of the invention and are not meant to be limitations upon the practice thereof. It is the following claims, including all equivalents, which define the scope of the invention.

I claim:

1. A method for the glow discharge deposition of a high quality layer of a hydrogenated, silicon containing semiconductor alloy material, including steps of:

providing a deposition system having a plasma region defined therein, said system including a conduit for introducing a preselected process gas therein to and a source of electromagnetic energy for activating said process gas in said plasma region so as to form a plasma therefrom;

supporting a substrate in said deposition system;

introducing a process gas having hydrogen and at least silicon therein, into said system;

maintaining the process gas at a process pressure which is less than atmospheric;

inputting a preselected power level of electromagnetic energy into said process gas so as to create a plasma from, and decompose, the process gas into deposition species which deposit a layer of a hydrogenated, silicon containing, semiconductor alloy material on the substrate, at a deposition rate corresponding to said power level; and maintaining the substrate at a preselected temperature which has been determined to be positively correlated with the deposition rate and which is high enough to impart sufficient kinetic energy to the layer to activate the removal of undesirable morphologies therefrom, but low enough to prevent degradation of the layer caused by loss of hydrogen.

2. A method as in claim 1, wherein the step of maintaining the substrate at a preselected temperature comprises maintaining the substrate at a temperature:

in the range of 300°–350° C. when the deposition rate is in the range of 10–20 angstroms per second;

in the range of 325° C.–400° C. when the deposition rate is above 20, but below 50 angstroms per second; and in the range of 350° C.–500° C. when the deposition rate is 50 angstroms per second or greater.

3. A method as in claim 1, wherein the step of maintaining the substrate at a preselected temperature comprises:

maintaining the substrate at a temperature of:
 300° C.–350° C. when the deposition rate is 10 angstroms per second;
 300° C.–400° C. when the deposition rate is 20 angstroms per second;
 300° C.–440° C. when the deposition rate is 30 angstroms per second;
 315° C.–475° C. when the deposition rate is 40 angstroms per second;
 325° C.–500° C. when the deposition rate is 50 angstroms per second; and
 350° C.–515° C. when the deposition rate is 60 angstroms per second.

4. A method as in claim 1, wherein the step of introducing a process gas having at least silicon comprises introducing a process gas further including germanium.

5. A method at in claim 1 wherein the process gas further includes a member selected from the group consisting of halogens, Group III elements, Group V elements, and combinations thereof.

6. A method as in claim 1, wherein the process gas includes a member selected from the group consisting of $SiH_4$, $S_2H_6$, $SiF_4$, and combinations thereof with $GeH_4$ or $GeF_4$.

7. A method as in claim 1, wherein the step of inputting a preselected power level of electromagnetic energy comprises inputting microwave energy.

8. A method as in claim 1, wherein the step of inputting a preselected power level of electromagnetic energy comprises inputting radio frequency energy.

9. In a method for the manufacture of a photovoltaic device of the type including an intrinsic layer of a hydrogenated, silicon containing semiconductor material interposed between oppositely doped layers of semiconductor material, wherein said intrinsic layer is deposited by a glow discharge deposition process which comprises:

providing a deposition system having a plasma region defined therein, said system including means for introducing a preselected process gas thereinto and a source of electromagnetic energy for activating the process gas in the plasma region to form a plasma therefrom;

supporting a substrate in the deposition system;

introducing a process gas including hydrogen and at least silicon therein, into said system;

maintaining the process gas at a process pressure which is less than atmospheric;

inputting a preselected power level of electromagnetic energy into the process gas so as to create a plasma from, and decompose, the process gas into deposition species which deposit a layer of a hydrogenated, silicon containing, semiconductor alloy material on the substrate, at a deposition rate corresponding to said power level, wherein the improvement comprises in combination: maintaining the substrate at a preselected temperature which has been determined to be positively correlated with the deposition rate and which is high enough to impart sufficient kinetic energy to the layer to activate she removal of undesirable morphologies therefrom, but low enough to prevent degradation of the layer caused by loss of hydrogen.

* * * * *